(12) United States Patent
Mayzlin

(10) Patent No.: US 9,036,670 B2
(45) Date of Patent: May 19, 2015

(54) METHOD FOR OPTICAL FREQUENCY SYNTHESIS

(71) Applicant: TOPTICA Photonics AG, Graefelfing (DE)

(72) Inventor: Yuriy Mayzlin, Munich (DE)

(73) Assignee: TOPTICA Photonics AG, Graefelfing (DE)

( * ) Notice: Subject to any disclaimer, the term of this patent is extended or adjusted under 35 U.S.C. 154(b) by 0 days.

(21) Appl. No.: 14/294,217

(22) Filed: Jun. 3, 2014

(65) Prior Publication Data

US 2014/0355631 A1    Dec. 4, 2014

(30) Foreign Application Priority Data

Jun. 4, 2013   (DE) .................. 10 2013 009 264

(51) Int. Cl.
| | | |
|---|---|---|
| *H01S 3/10* | (2006.01) | |
| *H01S 3/139* | (2006.01) | |
| *H01S 5/0687* | (2006.01) | |
| *G02F 2/00* | (2006.01) | |
| *H01S 5/00* | (2006.01) | |

(52) U.S. Cl.
CPC . *H01S 3/139* (2013.01); *G02F 2/00* (2013.01); *H01S 5/0085* (2013.01); *H01S 5/0687* (2013.01)

(58) Field of Classification Search
USPC ................ 372/9, 13, 20, 23, 25, 28
See application file for complete search history.

(56) References Cited

U.S. PATENT DOCUMENTS

2010/0002737 A1*   1/2010   Rausch et al. ................. 372/30

FOREIGN PATENT DOCUMENTS

| JP | 8-75541 | * 3/1996 |
| JP | 8-292266 | * 11/1996 |

* cited by examiner

*Primary Examiner* — Dung Nguyen
(74) *Attorney, Agent, or Firm* — Collard & Roe, P.C.

(57) ABSTRACT

A method for generation of electromagnetic radiation has the following method steps:
- generation of electromagnetic radiation at a useful frequency,
- division of the electromagnetic radiation into a useful beam and a secondary beam,
- frequency shift of the electromagnetic radiation of the secondary beam,
- control of the useful frequency as determined by a manipulated variable, wherein the manipulated variable is derived from the frequency-shifted radiation of the secondary beam.

19 Claims, 2 Drawing Sheets

METHOD FOR OPTICAL FREQUENCY SYNTHESIS

CROSS REFERENCE TO RELATED APPLICATIONS

Applicant claims priority under 35 U.S.C. §119 of German Application No. 10 2013 009 264.7 filed on Jun. 4, 2013, the disclosure of which is incorporated by reference.

BACKGROUND OF THE INVENTION

1. Field of the Invention

The invention relates to a method for generation of electromagnetic radiation. Furthermore, the invention relates to an optical frequency synthesizer.

2. The Prior Art

For different applications, for example in the field of optical spectroscopy, there is a need for light sources that are able to generate electromagnetic radiation having a predeterminable frequency. In this connection, it should be possible to adjust the frequency with great precision. In particular, there is a need for light sources that can be tuned over a broad bandwidth, in which the frequency can be freely predetermined within the available tuning range, whereby the predetermined frequency is known with great precision.

For example, it is known to couple the frequency of the radiation of a continuous-wave laser with the frequency of a spectral line of an optical frequency comb used as the frequency standard, by means of suitable regulation. A suitable regulator regulates the frequency by optical phase regulation, in such a manner that the frequency distance between the selected spectral line of the optical frequency comb and the shifted frequency of the main beam is given a predetermined value. This frequency distance is changed in order to obtain a desired frequency. If the frequency distance approaches half the distance between the spectral lines of the frequency comb, it is impossible to select the correct spectral line of the frequency comb. Therefore, setting just any desired frequency in the tuning range is also not possible. In order to solve this problem, an optical frequency shifter can be used in the useful beam of the continuous-wave laser. This method makes it possible to set more or less any desired frequencies with great precision. However, continuous tuning of the frequency of the continuous-wave laser continues to be impossible. Furthermore, it is disadvantageous that additional losses, amplitude modulations, and a beam offset in the main beam of the continuous-wave laser occur.

Another known approach is to couple the frequency of a continuous-wave laser, similar to what was described above, with a spectral line of an optical frequency comb, whereby then, the optical frequency comb is detuned in order to tune the frequency. It is true that the possibilities in frequency tuning are improved. However, this method makes it impossible to couple multiple light sources with a single optical frequency comb, independent of one another. As a result, various interesting areas of application are excluded. Furthermore, implementation of a highly precise and tunable frequency comb is complicated and difficult.

SUMMARY OF THE INVENTION

Against this background, it is therefore an object of the invention to make an improved method for optical frequency synthesis available.

This object is accomplished by a method for optical frequency synthesis according to the invention, in which first electromagnetic radiation is generated at a useful frequency, for example by means of a tunable continuous-wave laser. The electromagnetic radiation is then divided up into a useful beam and into a secondary beam. Beam splitters of a known type can serve for this. In the secondary beam, the frequency of the electromagnetic radiation is shifted. A frequency shifter of a known type, such as, for example, an acousto-optic modulator, which is operated at a changeable ultrasound frequency, can be used for this. Finally, a manipulated variable is derived from the frequency-shifted radiation of the secondary beam, by means of a suitable regulator, which variable is then used to control the useful frequency. For example, a control variable results, from which the regulator then derives the manipulated variable from a comparison of the frequency-shifted radiation of the secondary beam with the frequency of a spectral line of a suitable reference spectrum. In this connection, the control variable can be the frequency distance between a spectral line of the reference spectrum and the frequency of the frequency-shifted radiation of the secondary beam. The frequency shift in the secondary beam is fed back to the useful beam by way of regulation, according to the invention, because the manipulated variable controls the useful frequency at the output of the regulator.

According to the method, the useful frequency is unambiguously defined by the frequency shift in combination with the method of regulation in the secondary beam. A desired useful frequency can be predetermined in any desired manner, in that the frequency shift and the frequency of the radiation of a reference radiation source are set accordingly, for example.

A significant advantage of the invention is that it makes any desired setting of the frequency of the useful beam possible. In this connection, no frequency shift in the useful beam is used, so that low losses and no amplitude modulations as well as no beam offset in the useful beam occur. A further advantage is that in the method according to the invention, it is not necessary to vary the reference spectrum. An optical frequency comb used as the reference radiation source, for example, does not need to be detuned in order to set the useful frequency to a specific reference frequency. This advantageously makes it possible to couple multiple useful radiation sources with a single optical frequency comb for the purpose of simultaneous regulation of the frequency, in each instance.

In a preferred embodiment of the invention, the derivation of the manipulated variable takes place by regulation on the basis of a comparison of the frequency of the frequency-shifted radiation of the secondary beam at the frequency of a spectral line of a reference spectrum having multiple spectral lines. In this connection, regulation maintains the frequency distance between the frequency-shifted radiation of the secondary beam and the frequency of the selected spectral line of the reference spectrum at a predetermined value. Because the frequency of the secondary beam is changed over time, regulation brings about a corresponding shift in the useful frequency. Thus, the frequency distance between the useful frequency and the frequency of the corresponding spectral line of the reference spectrum is defined in accordance with the current value of the frequency shift.

The reference spectrum can be determined by a transfer function of a filter, for example, into which the frequency-shifted radiation of the secondary beam is coupled. The reference spectrum can be, in particular, the transmission or reflection spectrum of an optical resonator or of an etalon. Likewise, it is possible that the reference spectrum is a transmission, absorption or luminescence spectrum of a gaseous, liquid or solid reference medium. Furthermore, the reference spectrum can be an emission spectrum of a reference radiation source.

If the reference spectrum is the reflection or transmission spectrum of an etalon, for example, into which the frequency-shifted radiation of the secondary beam is coupled, the manipulated variable can be derived from the intensity or amplitude of the radiation coupled out of the etalon. In this connection, the well-defined spectrum of the etalon serves as the frequency standard. Frequency regulation can take place, for example, by means of what is called "Side of Fringe" or "Peak Locking" regulation of a known type.

Alternatively, as already mentioned above, the reference spectrum can be the spectrum of an optical frequency comb or of another reference radiation source. In this connection, the frequency-shifted radiation of the secondary beam preferably has the radiation of the optical frequency comb superimposed on it, and regulation of the useful frequency takes place by means of optical frequency or phase regulation. In this manner, the frequency of the frequency-shifted radiation of the secondary beam is coupled with a spectral line of the reference radiation source. In this connection, the frequency shift in the secondary beam brings about a corresponding frequency shift of the useful beam. Optical frequency or phase regulation can take place, for example, according to a heterodyne model, whereby a superimposition signal is generated by superimposition of the frequency-shifted radiation of the secondary beam with the radiation of the reference radiation source, which signal is frequency-coupled or phase-coupled with a radio-frequency signal having a predetermined frequency. In this regulation model, the useful frequency is unambiguously defined, with great precision, by the frequency of the selected spectral line of the reference radiation source, the frequency of the radio-frequency signal, and the current frequency shift in the secondary beam. To tune the frequency, the spectrum of the reference radiation source can remain unchanged, while only the frequency shift and, if necessary, the radio-frequency of the heterodyne frequency or phase regulation are set accordingly.

A significant aspect of the use, according to the invention, of a reference spectrum having multiple (preferably equidistant) spectral lines, as made available by the etalon or also by means of the optical frequency comb, is that a slight change in the frequency shift of the secondary beam is sufficient to set any desired useful frequency within the framework of the tuning range of the radiation source used for generation of the useful beam. In this connection, the method according to the invention makes it possible, so to speak, for the regulation to move "hand over hand" along the reference spectrum, from spectral line to spectral line. For example, the frequency shift in the secondary beam is changed from an initial value to an end value. Because of the regulation according to the invention, the useful frequency changes accordingly, in this connection. If the change in the useful frequency is equal to the frequency distance between two spectral lines of the reference spectrum during this procedure, the frequency shift can be reset to the initial value after the end value has been reached, without the frequency of the useful beam changing as a result. This is due to the fact that when the frequency shift is reset to the initial value, the frequency distance between the frequency of the frequency-shifted radiation and one of the spectral lines of the reference spectrum, which distance is decisive for regulation, does not change. The frequency distance that is decisive for regulation is specifically now no longer the frequency distance between the frequency of the frequency-shifted radiation and the original spectral line of the reference spectrum that formed the basis of regulation, but rather the frequency distance between the frequency of the frequency-shifted radiation of the secondary beam and the spectral line of the reference spectrum that now lies closes to this frequency, after the frequency shift was reset. It is actually sufficient that the change in the frequency shift of the secondary beam is greater than or equal to half the frequency distance between two spectral lines of the reference spectrum. Even if the frequency was not shifted over the full distance between two spectral lines of the reference spectrum as a result of the frequency shift, regulation ensures that the given frequency distance is regulated relative to the next spectral line of the reference spectrum.

In order to set the useful frequency to any desired value on the basis of the above explanations, it is practical if the frequency shift takes place in multiple steps that follow one another in terms of time, whereby the frequency of the electromagnetic radiation of the secondary beam is changed from the initial value to an end value, the difference of which corresponds to the amount of the frequency shift, at every step. Because regulation is supposed to engage into the next spectral line of the reference spectrum, in each instance, at every step, resetting of the frequency shift from the end value to the initial value should take place suddenly at the end of the step, in other words within a time interval that is shorter than the time constant (the inverse bandwidth) of the regulation, in any case. In practice, this means, for example, that the frequency shift is changed from the initial value to the end value slowly in the case of a frequency change that is linear over time, with a saw-tooth-like progression, in other words within a time interval that is greater than the time constant of the regulation. After the end value has been reached, the frequency shift jumps back to the initial value. Afterward, the next step begins. In this method, the useful frequency is unambiguously defined by the frequency distance between the spectral lines of the reference spectrum, the number of steps, and the current frequency shift.

The amount of the frequency shift must be adapted to the reference spectrum in the case of the model described above. It is easily possible to continuously readjust this adaptation. For this purpose, the change can be automatically adapted after every step, for example, specifically in accordance with an incorrect adaptation of the frequency determined before or after resetting the frequency shift to the initial value. In this way, possible drift of the reference spectrum can also be balanced out automatically.

In the model described above, the inertia of the regulation is utilized after every step, so that the next spectral line of the reference spectrum is selected by the regulation. If this is not possible, for example because the regulation has an overly high bandwidth, it can be provided that the manipulated variable at the output of the regulator is maintained, in other words "frozen" after every step, i.e. when resetting the frequency shift to the initial value. In this way, the useful frequency is maintained at the last value and the regulation is forced to lock into the next spectral line of the reference spectrum, so to speak, after the frequency shift has reached the initial value once again.

If the useful frequency has reached a predetermined reference frequency, the frequency shift of the electromagnetic radiation of the secondary beam can be stopped. The useful frequency then remains at the set value with great precision, which corresponds to the precision of the frequency standard used.

An optical frequency synthesizer according to the invention has at least one tunable laser for generation of electromagnetic radiation at a useful frequency, as well as a beam splitter for division of the electromagnetic radiation of the tunable laser into a useful beam and a secondary beam, at least one frequency shifter for frequency shift of the electromagnetic radiation of the secondary beam, and at least one regulator connected with the tunable laser, which is set up for controlling the useful frequency as determined by a manipulated variable, whereby the regulator derives the manipulated variable from the radiation of the frequency-shifted radiation of the secondary beam.

In a preferred embodiment of the optical frequency synthesizer, the regulator can be set up for deriving the manipulated variable by means of a comparison of the frequency of the frequency-shifted radiation of the secondary beam with the frequency of a spectral line of a reference spectrum having multiple spectral lines, whereby the regulator regulates the frequency distance between the frequency of the frequency-shifted radiation of the secondary beam and the frequency of the spectral line of the reference spectrum to a predetermined value. In this connection, as mentioned above, the reference spectrum can be the spectrum of an etalon or the spectrum of an optical frequency comb, which spectrum is generated by means of a corresponding comb generation apparatus. A mode-coupled laser of a known type, which emits radiation with a spectrum in the form of an optical frequency comb, is suitable as a comb generation apparatus, whereby the frequencies of the spectral lines of the frequency comb are regulated with great precision, for example by means of self-referencing in known manner, if necessary in combination with coupling to a different high-precision frequency standard (e.g. atomic clock).

The invention makes it possible to implement a frequency synthesizer that simultaneously emits electromagnetic radiation at different useful frequencies. For this purpose, the optical frequency synthesizer has two or more tunable lasers for generation of electromagnetic radiation at a different useful frequency, in each instance, as well as two or more beam splitters for division of the electromagnetic radiation of each tunable laser into a useful beam and into a secondary beam. In this connection, the regulator is then set up in such a manner that it derives a manipulated variable for each tunable laser, by means of a comparison of the frequency of the frequency-shifted radiation of the secondary beam, with the frequency of a spectral line of the optical frequency comb. The regulator regulates the frequency distance between the frequency of the frequency-shifted radiation of the secondary beam, and the frequency of one of the spectral lines of the reference spectrum to a predetermined value. This embodiment of the invention makes it possible to couple multiple tunable lasers with a single optical frequency comb, in order to generate electromagnetic radiation at different predeterminable useful frequencies with great precision of frequency regulation in this manner.

As is immediately obvious, the regulation model according to the invention can advantageously be used to generate radiation having spectral components that have a defined frequency distance. This can be used in a practical manner in the generation of terahertz radiation, for example. In this connection, the desired frequency distance can be set between a spectral line of the reference radiation source and the frequency of the useful beam, for example, and varied as needed.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF THE EMBODIMENTS

Figure 1:
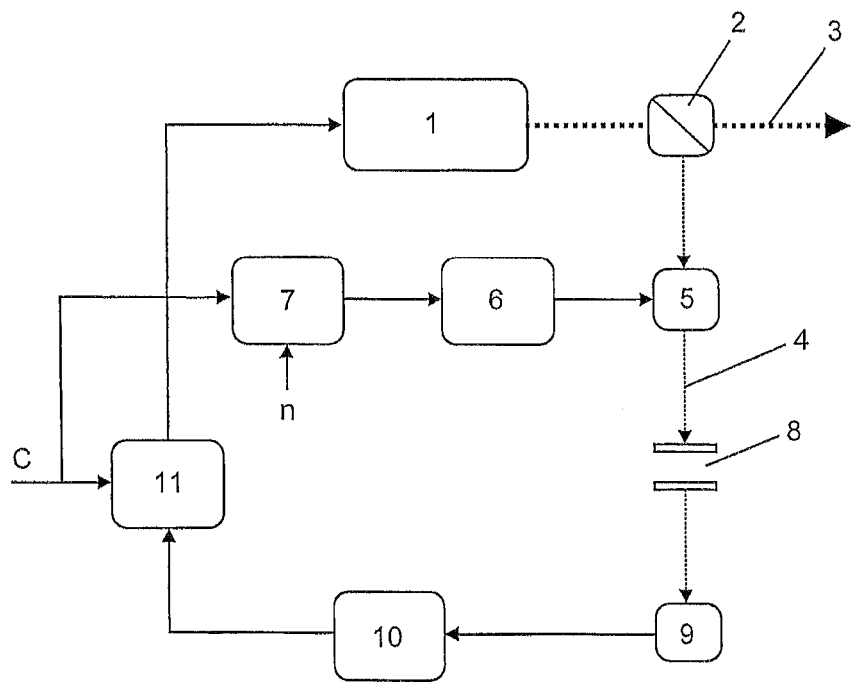
FIG. 1 is a block schematic of an optical frequency synthesizer according to the invention, in accordance with a first exemplary embodiment.

FIG. 1 schematically shows the structure of an optical frequency synthesizer according to the invention in the form of a block schematic. The frequency synthesizer comprises a tunable laser 1, for example in the form of a diode laser. This laser emits electromagnetic radiation at a useful frequency. A beam splitter 2 divides the electromagnetic radiation of the laser 1 into a useful beam 3 and a secondary beam 4. The secondary beam 4 is passed to a frequency shifter in the form of an acousto-optic modulator 5. The acousto-optic modulator 5 has a piezo element (not shown), which has an alternating voltage in the ultrasound frequency range applied to it. This alternating voltage is generated by a frequency generator 6. The frequency generator 6 can be a digital synthesizer of a known type. The frequency of the alternating voltage determines a frequency shift of the electromagnetic radiation of the secondary beam 4. A frequency modulator 7 modulates the frequency of the alternating voltage generated by the frequency generator 6 and thereby the frequency shift of the radiation of the secondary beam 4 generated by the acousto-optic modulator 5. The acousto-optic modulator 5 can have the secondary beam 4 run through it in a double-pass arrangement, i.e. twice.

The frequency-shifted radiation of the secondary beam 4 is coupled into an etalon 8. The radiation coupled out of the etalon 8 is passed to a photodiode 9. The latter delivers a signal that is proportional to the intensity of the radiation of the secondary beam coupled out of the etalon. The output signal of the photodiode 9 is the control variable of a regulation circuit in the exemplary embodiment shown. Accordingly, the output signal of the photodiode 9 is passed to a regulator 10 that derives a manipulated variable from it, which variable is passed back to the tunable laser 1. In this connection, the regulator 10 is set up in such a manner that the control variable, that is the intensity of the radiation of the secondary beam impacting on the photodiode 9, is set to a predetermined, fixed value. The manipulated variable can be a control signal with which corresponding actuators of the tunable laser are set, for example in order to vary the position of a refraction grid of the tunable laser 1. In this manner, the useful frequency, in other words the frequency of the useful beam 3, is controlled in accordance with the manipulated variable. In place of the "Side of Fringe" regulation described, what is called "Peak Locking" regulation can also be used.

A comparison of the frequency of the frequency-shifted radiation of the secondary beam 4 with the frequency of a spectral line of the reference spectrum of the etalon 8, which spectrum has multiple equidistant spectral lines, takes place by the measurement of the intensity of the radiation of the secondary beam 4 transmitted by the etalon 8. In this connection, the regulator 10 keeps the frequency distance between the frequency of the frequency-shifted radiation of the secondary beam 4 and the frequency of the corresponding spectral line of the reference spectrum at a predetermined value. To put it differently, the regulator 10 shown regulates the useful frequency by coupling to a spectral line of the transmission spectrum of the etalon 8.

As is furthermore shown in FIG. 1, the output signal of the regulator 10 is combined with an external control signal (reference variable) C in an element 11 (e.g. adder). The combined signal is passed to the laser 1. Furthermore, the control signal C is passed to the frequency modulator 7 in the exemplary embodiment of FIG. 1, whereby this modulator ensures a specific frequency shift of the secondary beam 4 in accordance with the control signal C, so that a suitable spectral line of the transmission spectrum of the etalon 8 is selected in accordance with the control signal C (feed-forward regulation).

Figure 2:
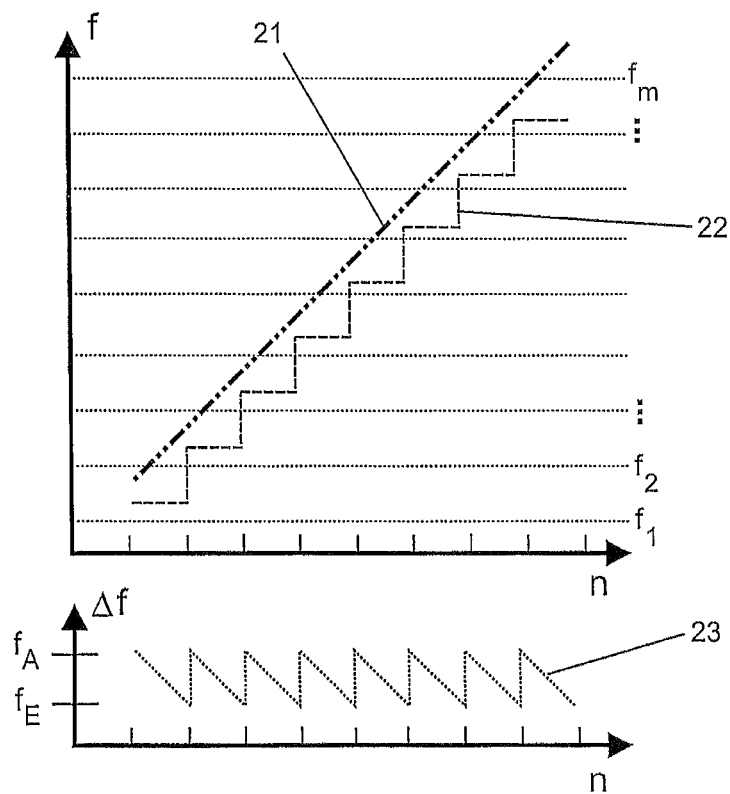
FIG. 2 is an illustration of the frequency regulation model according to the invention, using diagrams.

The method of procedure in the case of linear tuning of the frequency of the useful radiation 3, according to the invention, is illustrated in FIG. 2.

The upper diagram in FIG. 2 shows the frequency f as a function of the index n. n indicates a plurality of steps carried out one after the other in terms of time. In the diagram, the progression of the useful frequency is indicated with the reference number 21. The reference number 22 refers to the progression of the frequency of the frequency-shifted secondary beam 4. The reference number 23 in the lower diagram of FIG. 2 refers to the time-dependent frequency shift $\Delta f$ in the secondary beam 4. In the upper diagram of FIG. 2, the frequencies $f_1, f_2, \ldots, f_m$ of the equidistant spectral lines of the reference spectrum are additionally shown.

As can be seen in the lower diagram of FIG. 2, the frequency shift takes place in multiple steps that follow one another in terms of time, whereby the frequency shifter 5 brings about a frequency shift $\Delta f$ of the electromagnetic radiation of the secondary beam 4, which changes from an initial value $f_A$ to an end value $f_E$ during every step. In the exemplary embodiment shown, the change in the frequency shift $\Delta f$ takes place in linearly decreasing manner during every step. In this connection, the amount corresponds to the difference between end value $f_E$ and initial value $f_A$. As explained above, the regulator 10 equalizes the phase shift, in that it continuously readjusts the frequency of the laser 1. In this connection, it ensures that the frequency distance between the frequency 22 of the frequency-shifted radiation of the secondary beam 4 and the frequency of the next adjacent spectral line $f_1, f_2, \ldots, f_m$ of the reference spectrum remains constant over time. This can be seen in the upper diagram in FIG. 2. The frequency 22 runs horizontally during every step, whereby the distance between the frequency 22 and the adjacent spectral line $f_1, f_2, \ldots, f_m$, in each instance, remains constant. At the end of each step, the frequency shift $\Delta f$ jumps back from the end value $f_E$ to the initial value $f_A$, so that the saw-tooth profile that can be seen in the lower diagram of FIG. 2 results. During this jump, the frequency 21 of the useful beam 3 remains constant, specifically on the basis of the inertia of the regulation or because the regulator temporarily "freezes" the manipulated variable at its output, for the period of the jump of the frequency shift. Afterward, the regulation engages into the next adjacent spectral line $f_1, f_2, \ldots, f_m$, so that then, the frequency 22 of the frequency-shifted radiation of the secondary beam 4 is kept constant relative to this next spectral line. The stair-shaped progression of the frequency 22 that can be seen in the upper diagram in FIG. 2 results from this.

The diagrams in FIG. 2 illustrate how the frequency 21 of the laser 1 can be tuned over many spectral lines $f_1, f_2, \ldots, f_m$ of the reference spectrum, in that a corresponding number of steps is performed. In this connection, it is essential that the amount of the frequency shift $\Delta f$ is greater than half the frequency distance between two spectral lines $f_1, f_2, \ldots, f_m$.

Regulation can be stopped at any desired point. The current frequency 21 of the useful beam 3 is then unambiguously defined by the index n, the current frequency shift $\Delta f$, and the location of the spectral lines $f_1, f_2, \ldots, f_m$ of the reference spectrum.

The method according to the invention makes broad tenability of the laser 1 possible, specifically with a precision that corresponds to that of the reference spectrum.

Figure 3:
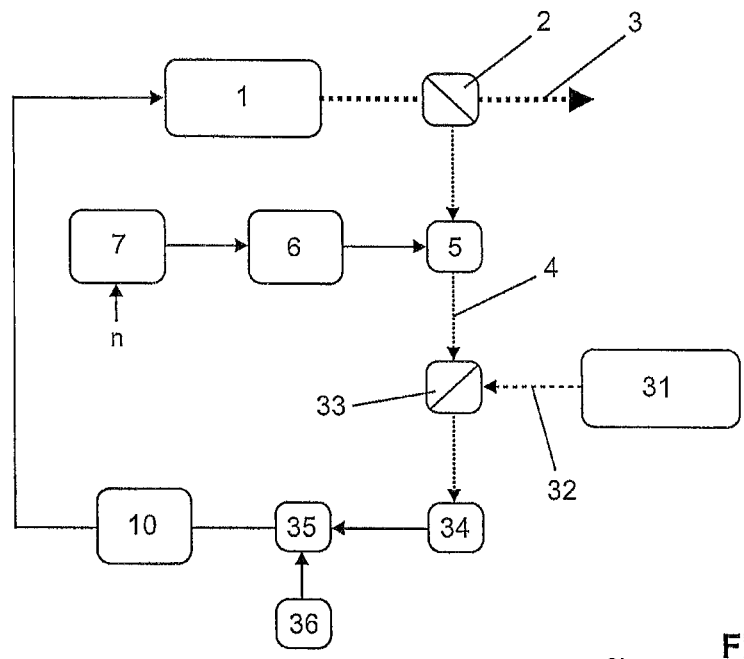
FIG. 3 is a block schematic of a second exemplary embodiment of an optical frequency synthesizer according to the invention.

In FIG. 3, an exemplary embodiment is shown in which a comb generation apparatus 31 is used to make the reference spectrum available, in place of an etalon 8. The comb generation apparatus 31 comprises a mode-coupled laser that generates radiation with a spectrum in the form of an optical frequency comb. Such comb generation apparatuses are known from the state of the art. These are already being used in different ways as a frequency standard. The frequencies of the spectral lines of the frequency comb are defined with great precision. In this connection, the frequencies of the spectral lines are given by $f_m = f_{CEO} + m \times f_r$. The optical frequency comb therefore begins at the (imaginary) first comb line having the frequency $f_{CEO}$ ("carrier envelope offset"). A whole-number ordinal number m is assigned to each comb line. The distance between the comb lines amounts to $f_r$. $f_r$ is the repetition frequency of the mode-coupled laser.

In the embodiment shown in FIG. 3, the radiation 32 has the frequency-shifted radiation of the secondary beam 4 superimposed on it by way of a beam splitter 33, on a photodiode 34. The resulting high-frequency beat signal is passed to a phase detector 35 (preferably after bandpass filtering). In this manner, optical phase regulation according to a heterodyne model is implemented. The high-frequency superimposition signal that occurs at the output of the phase detector 35 is phase-coupled with a radio-frequency signal having a fixed frequency, generated by a radio-frequency signal generator 36. In this connection, the frequency of the radio-frequency signal determines the distance between the frequency of the frequency-shifted radiation of the secondary beam 4 and the adjacent spectral line of the reference spectrum, in each instance, set by means of the regulator 10.

Optionally, the frequency generator 6 and/or the radio-frequency generator 36 can be synchronized with the repetition frequency $f_r$ of the comb generation apparatus 31.

Figure 4:
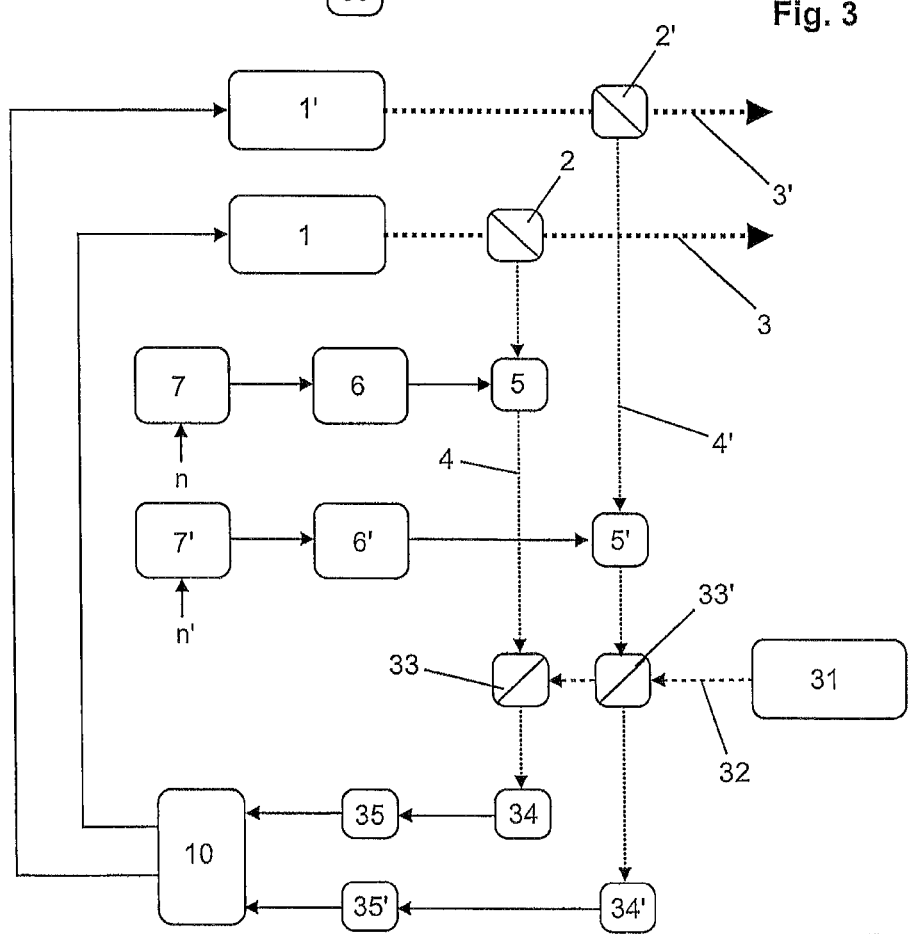
FIG. 4 shows an optical frequency synthesizer according to the invention, having two tunable lasers.

In the embodiment shown in FIG. 4, two tunable lasers 1 and 1' are provided, which emit electromagnetic radiation at a different useful frequency, in each instance. Accordingly, two beam splitters 2 and 2' are provided, which divide the radiation of each laser 1, 1' into a useful beam 3 and 3', respectively, and a secondary beam 4 and 4', respectively. In each secondary beam 4 and 4', a frequency shift takes place, as described above with reference to the exemplary embodiments of FIGS. 1 and 3. The two frequency-shifted secondary beams 4 and 4' have the radiation of a comb generation apparatus 31 superimposed on them by means of two beam splitters 33 and 33', specifically on photodiodes 34 and 34'. In this way, optical phase detection of the kind described above takes place. The resulting control variables are passed to the regulator 10. The regulator 10 derives an individual manipulated variable for each tunable laser 1 or 1' from this, in order to keep the frequency distance of the frequency shift in each secondary beam 4 and 4' constant over time, with regard to a spectral line of the optical frequency comb, in each instance.

FIG. 4 thereby illustrates how the regulation model according to the invention can be used to couple two (or more) tunable lasers 1, 1' with a single optical frequency comb.

Accordingly, while only a few embodiments of the present invention have been shown and described, it is obvious that many changes and modifications may be made thereunto without departing from the spirit and scope of the invention.

What is claimed is:

1. A method for generation of electromagnetic radiation, comprising the following steps:
    generating electromagnetic radiation at a useful frequency,
    dividing the electromagnetic radiation into a useful beam and a secondary beam,
    shifting a frequency of the electromagnetic radiation of the secondary beam,
    controlling the useful frequency as determined by a manipulated variable, wherein the manipulated variable is derived from the frequency-shifted radiation of the secondary beam.

2. The method according to claim 1, wherein the step of generating the electromagnetic radiation takes place by a tunable continuous-wave laser.

3. The method according to claim 1, wherein the derivation of the manipulated variable takes place by regulation on the basis of a comparison of the frequency of the frequency-shifted radiation of the secondary beam with the frequency $(f_1, f_2, \ldots, f_m)$ of a spectral line of a reference spectrum having multiple spectral lines, so that a frequency distance between the frequency of the frequency-shifted radiation of the secondary beam and the frequency $(f_1, f_2, \ldots, f_m)$ of the spectral line of the reference spectrum is predetermined.

4. The method according to claim 3, wherein the reference spectrum is determined by a transfer function of a filter, into which the frequency-shifted radiation of the secondary beam is coupled.

5. The method according to claim 4, wherein the reference spectrum is a transmission or reflection spectrum of an optical resonator or of an etalon.

6. Method according to claim 3, wherein the reference spectrum is a transmission, absorption or luminescence spectrum of a gaseous, liquid or solid reference medium.

7. The method according to claim 3, wherein the reference spectrum is an emission spectrum of a reference radiation source.

8. The method according to claim 7, wherein the frequency-shifted radiation of the secondary beam generates a beat signal with a radiation of a reference radiation source, the radiation of which has the frequency-shifted radiation of the secondary beam imposed thereon, and regulation of the useful frequency takes place according to a heterodyne model, wherein the beat signal is phase-coupled or frequency-coupled with a reference signal having a predetermined frequency.

9. The method according to claim 7, wherein the reference spectrum is the spectrum of an optical frequency comb.

10. The method according to claim 3, wherein the amount of the frequency shift of the secondary beam is greater than or equal to half the frequency distance between two spectral lines of the reference spectrum.

11. The method according to claim 10, wherein the frequency shift takes place in multiple steps that follow one another in terms of time, wherein the frequency shift of the electromagnetic radiation of the secondary beam is changed from an initial value $(f_A)$ to an end value $(f_E)$ during every one of said steps, the difference between said values corresponding to the amount of the frequency shift.

12. The method according to claim 11, wherein after each step, the manipulated variable is kept constant when the frequency shift is reset from the end value $(f_E)$ to the initial value $(f_A)$.

13. The method according to claim 1, wherein the frequency shift of the electromagnetic radiation of the secondary beam is stopped as soon as the useful frequency is equal to a reference frequency.

14. The method according to claim 10, wherein the amount of the frequency shift of the secondary beam is essentially equal to the frequency distance between two spectral lines of the reference spectrum.

15. An optical frequency synthesizer comprising:
    at least one tunable laser for generation of electromagnetic radiation at a useful frequency,
    at least one beam splitter for division of the electromagnetic radiation of the tunable laser into a useful beam and a secondary beam,
    at least one frequency shifter for frequency shift of the electromagnetic radiation of the secondary beam, and
    at least one regulator connected with the tunable laser, said regulator being adapted for controlling the useful frequency as determined by a manipulated variable, wherein the regulator derives the manipulated variable from the radiation of the frequency-shifted radiation of the secondary beam.

16. The optical frequency synthesizer according to claim 15, wherein the laser is a tunable continuous-wave laser.

17. The optical frequency synthesizer according to claim 15, wherein the regulator is set up for deriving the manipulated variable by a comparison of a frequency of the frequency-shifted radiation of the secondary beam with a frequency $(f_1, f_2, \ldots, f_m)$ of a spectral line of a reference spectrum having multiple spectral lines, wherein the regulator regulates a frequency distance between the frequency of the frequency-shifted radiation of the secondary beam and the frequency $(f_1, f_2, \ldots, f_m)$ of the spectral line of the reference spectrum to a predetermined value.

18. The optical frequency synthesizer according to claim 17, wherein there are
    at least two tunable lasers for generation of electromagnetic radiation at a different useful frequency, and
    at least two beam splitters for division of the electromagnetic radiation of each tunable laser into a useful beam and into a secondary beam,
    wherein the regulator is set up for deriving a manipulated variable for each tunable laser, by a comparison of the frequency of the frequency-shifted radiation of each secondary beam with the frequency of a spectral line of the reference spectrum,
    wherein the regulator regulates the frequency distance between the frequency of the frequency-shifted radiation of each secondary beam and the frequency of one of the spectral lines of the reference spectrum to a predetermined value.

19. The optical frequency synthesizer according to claim 15, wherein the frequency shifter comprises an acousto-optic modulator.

* * * * *